(12) United States Patent
Rinzler et al.

(10) Patent No.: US 9,368,291 B2
(45) Date of Patent: Jun. 14, 2016

(54) HIGHLY ACCESSIBLE, NANOTUBE ELECTRODES FOR LARGE SURFACE AREA CONTACT APPLICATIONS

(75) Inventors: Andrew Gabriel Rinzler, Newberry, FL (US); John R. Reynolds, Gainesville, FL (US); Rajib Kumar Das, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 12/732,438

(22) Filed: Mar. 26, 2010

(65) Prior Publication Data

US 2010/0207074 A1 Aug. 19, 2010

Related U.S. Application Data

(62) Division of application No. 11/853,963, filed on Sep. 12, 2007, now Pat. No. 7,704,479.

(60) Provisional application No. 60/843,939, filed on Sep. 12, 2006.

(51) Int. Cl.
*H01B 1/04* (2006.01)
*H01G 11/36* (2013.01)
(Continued)

(52) U.S. Cl.
CPC ............... *H01G 11/36* (2013.01); *B82Y 10/00* (2013.01); *H01L 51/444* (2013.01); *Y02E 60/13* (2013.01); *Y10S 977/75* (2013.01); *Y10T 428/24603* (2015.01)

(58) Field of Classification Search
CPC .................. B82Y 10/00; H01G 11/36

USPC .............. 423/447.1; 977/750; 205/109
See application file for complete search history.

(56) References Cited

U.S. PATENT DOCUMENTS 5,560,898 A 10/1996 Uchida et al.
7,122,165 B2 10/2006 Wong et al.
(Continued)

FOREIGN PATENT DOCUMENTS

CN 1546431 11/2004
JP H07-048111 A 2/1995
(Continued)

OTHER PUBLICATIONS

Nilsson et al. "Scanning field emission from patterned carbon nanotube films", Applied Physics Letters, 76(15), 2000, 2071-2073.*
(Continued)

*Primary Examiner* — Rebecca Lee
(74) *Attorney, Agent, or Firm* — Wolf, Greenfield & Sacks, P.C.

(57) ABSTRACT

An highly porous electrically conducting film that includes a plurality of carbon nanotubes, nanowires or a combination of both. The highly porous electrically conducting film exhibits an electrical resistivity of less than 0.1 Ω·cm at 25 C and a density of between 0.05 and 0.70 g/cm$^3$. The film can exhibit a density between 0.50 and 0.85 g/cm$^3$ and an electrical resistivity of less than $6\times10^{-3}$ Ω·cm at 25 C. Also included is a method of forming these highly porous electrically conducting films by forming a composite film using carbon nanotubes or nanowires and sacrificial nanoparticles or microparticles. At least a portion of the nanoparticles or microparticles are then removed from the composite film to form the highly porous electrically conducting film.

7 Claims, 6 Drawing Sheets

(51) Int. Cl.
*B82Y 10/00* (2011.01)
*D01F 9/12* (2006.01)
*H01L 51/44* (2006.01)

(56) References Cited

U.S. PATENT DOCUMENTS

| | | |
|---|---|---|
| 7,261,852 B2 | 8/2007 | Rinzler et al. |
| 2002/0172639 A1 | 11/2002 | Horiuchi et al. |
| 2004/0197546 A1 | 10/2004 | Rinzler et al. |
| 2004/0198850 A1 | 10/2004 | Connor et al. |
| 2005/0026411 A1 | 2/2005 | Tanamoto et al. |
| 2005/0147553 A1 | 7/2005 | Wong et al. |
| 2005/0266162 A1 | 12/2005 | Luo et al. |
| 2006/0029537 A1 | 2/2006 | Zhang et al. |
| 2006/0220251 A1 | 10/2006 | Kloster et al. |
| 2007/0141345 A1 | 6/2007 | Rinzler et al. |

FOREIGN PATENT DOCUMENTS

| | | |
|---|---|---|
| JP | 2002-346996 A | 12/2002 |
| JP | 2004-315297 | 11/2004 |
| JP | 2005-057012 | 3/2005 |
| JP | 2007515364 A | 6/2007 |
| WO | WO-97-00925 | 1/1997 |
| WO | WO 2005044723 A2 | 5/2005 |
| WO | WO-2006-001790 | 1/2006 |

OTHER PUBLICATIONS

Machine translation of JP 2004315297.*
Raudino, A., et al., "Modeling of low-temperature depolymerization of poly(methyl methacrylate) promoted by ion beam,", *Journal of Chemical Physics*, 1999, pp. 1721-1731, vol. 111, No. 4.
Ryan, B., et al., "Novel sub-ceiling temperature rapid depolymerization-repolymerization reactions of cyanoacrylate polymers," *Macromolecular Rapid Communications*, 1996.
Pawlowski, G., et al., "Novel photoacid generators. Key components for the progress of chemically amplified photoresist systems," *Journal of Photopolymer Science and Technology*, 1991, pp. 389-402, vol. 4, No. 3.
Yamada, S., et al., "Toward Environmentally Friendly Photolithographic Materials: A New Class of Water-Soluble Photoresists," *Macromolecules*, 2004, pp. 377-384, vol. 37, No. 2.
Godbole, et al., "Deposition and characterization of silver nano-films by a novel solid liquid interface reaction technique (SLIRT)", *Materials Letters*, 2005, pp. 1958-1961, vol. 59.
Final Office Action in Japanese Patent Application No. 2009-528441 dated Apr. 1, 2014.
Japanese Office Action issued Nov. 11, 2014 in connection with Application No. 2009-528441.

* cited by examiner

HIGHLY ACCESSIBLE, NANOTUBE ELECTRODES FOR LARGE SURFACE AREA CONTACT APPLICATIONS

CROSS-REFERENCE TO RELATED APPLICATIONS

This application is a divisional of U.S. Ser. No. 11/853,963, filed Sep. 12, 2007 now U.S. Pat. No. 7,704,479, which claims priority to U.S. Provisional Application No. 60/843,939, filed on Sep. 12, 2006, the disclosure of which is hereby incorporated by reference in its entirety, including all figures, tables and drawings.

FIELD OF THE INVENTION

The invention relates to highly porous nanotube films, methods of forming such films, and applications for such films.

BACKGROUND OF THE INVENTION

In the majority of devices and applications requiring electrical contact, the required contact occurs at an essentially planar (2D) interface between an electrode and the material being contacted. What appears planar at long length scales generally acquires some corrugation at small length scales. However this corrugation is generally a natural consequence of the materials rather than a feature specifically engineered into the interface. However, numerous applications can benefit from an electrical contact that is 3-dimensionally distributed.

Examples of applications that can benefit from 3-dimensionally distributed contacts include electrodes for electrochemical reactions such as for the production of hydrogen from water and proton generation at the anode in hydrogen fuel cells. In such applications the increased surface area electrode provides an increase in electrochemically generated product. For super-capacitors, the increased electrode surface area greatly increases the device capacitance. Other applications, such as for solar cells or photodetectors, where light must be absorbed within a semiconducting junction region possessing a built-in potential to drive the photo-generated electrons to the cathode, can similarly benefit from the extended active area volume that a 3-dimensionally distributed electrode can provide. For electroluminescent device applications increased surface area electrical contact to the active material can provide increased current injection, with concomitant increases in light generation.

Recently, films of single-wall carbon nanotubes (SWNTs), which are electrically conducting have emerged as promising electrodes for a broad range of applications. Such films can be fabricated by various methods including a method described in published U.S. Application No. 20040197546 (hereafter the '546 application) to a group of inventors including one of the present Inventors. The '546 application is incorporated by reference into the present application in its entirety. Briefly, the method described in the '546 application comprises filtration of a surfactant suspension of SWNTs onto the surface of a filtration membrane possessing pores too small for the SWNTs to pass through. The nanotubes accumulate at the surface of the membrane forming a film. Subsequent washing removes residual surfactant, while drying consolidates the nanotube film. Transfer of the film to a substrate of choice requires appropriate selection of the membrane media to permit its dissolution in a solvent that can be tolerated by the substrate to which the transfer is made. Such transfer generally proceeds by adhering the membrane-backed nanotube film to the substrate, followed by dissolution of the membrane in the chosen solvent.

SWNT films so fabricated possess a tortuous path, open porosity in which the pores between nanotubes are defined by the overlapping and crossing nanotube bundles. The nanotubes tend to be self-organized into bundles, each possessing a varying number of nanotubes across their widths from a few to hundreds of parallel nanotubes, approximately 3 to 20 nm in diameter, with a typical diameter of ~10 nm. FIG. 1 shows a scanned atomic force microscopy (AFM) image of a typical 70 nm thick film surface (bundles diameters appear greater than ~10 nm only because of tip-sample convolution). This open porosity has the potential to provide a structure having some of the desired, high surface area, 3-dimensionally distributed electrical contact with another material.

Examination of FIG. 1 suggests that voids between crossing nanotube bundles have dimensions of tens to hundreds of nanometers across. However, the inference of pore volumes from such surface images is misleading. In the film formation process disclosed in the '546 application the nanotube bundles are uniformly dispersed in the dilute, aqueous suspension. The first bundles to land on the flat filtration membrane surface are forced to lie essentially parallel to the surface. Because the film grows at a uniform rate (with nanotube bundles lying across those deposited before them), subsequently deposited bundles take on the same planar orientations. The result is a film morphology wherein the nanotubes have random in plane orientations, but lie in stacked planes, with two-dimensional anisotropy similar to a biaxial oriented polymer film. This would suggest that the average dimension of the pores between bundles, in the direction perpendicular to the filtration membrane surface (the thickness direction of the film), is that of only a few nanotube bundle diameters. This analysis assumes however that the nanotube bundles are rigid rods.

The nanotube flexibility, and surface energy minimization by van der Waals contact causes them to maximize their contact, acting to further reduce these pore volumes. A quantitative measure of the available porosity is given by a comparison of the theoretical density of a hexagonal close pack array of nanotubes (using a prototypical 1.356 nm diameter (10, 10) nanotube) and the experimentally derived density of a filtration method formed SWNT film. The former is approximately 1.33 g/cm$^3$ while the latter has been measured to be about 0.71 g/cm$^3$. Hence the as-produced filtration method described in the '546 application produces SWNT films that achieve nearly 53% of their theoretical maximum density. Since this porosity is generally uniformly distributed throughout the film, the average pore volume is generally of a size that is smaller even than an average bundle volume.

There may be utility to infiltrating the porosity of films produced using the process disclosed in the '546 application with an electro-active medium and using the nanotubes as electrodes. However, the small size of these pores limits the utility of this structure for 3-dimensional distributed electrode applications. The limitations associated with the small pore size depends on the specific application, two exemplary limitations being as follows:

1. As electrochemical electrodes the small pores yield slow dynamics for permeating chemical species into the volume of the films, against the countercurrent of reaction products that must get out. This will limit the production rate of the desired species.

2. As photovoltaic electrodes, which are infiltrated with a semiconductor that generates a built-in potential at the nanotube-semiconductor interface, wherever the nanotubes defining the pores lie within a Debye length proximity of each other, their potentials will screen each other, reducing the potential gradient. Since that potential gradient provides the electromotive force for charge transport away from the interface, such screening will limit the photo-current and therefore the power generated by the photovoltaic device.

Thus, a need exists for nanotube and/or nanowire films having higher levels of porosity, significantly higher pore volumes, and a higher ratio of surface area to film volume as compared to films produced by the method described in the '546 application, or other methods of nanotube film fabrication such as spray coating or Langmuir-Blodgett assembly.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION OF THE INVENTION

Figure 1:
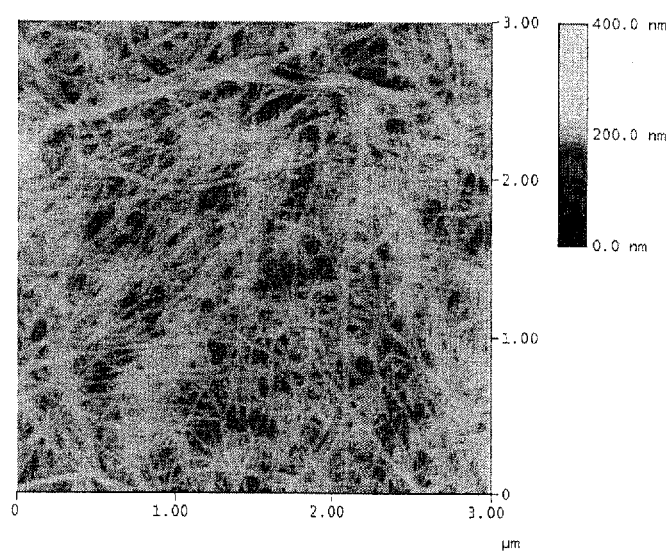
FIG. 1 is a scanned AFM image of a 70 nm thick SWNT film based on the method disclosed in the '546 application. The color-graded, vertical variations in the scanned image occupy only a small portion, near the middle, of the vertical scale (right).

One of the assumed advantages of nanotube films in electrode applications is their high surface area for electrical contact, deriving from their nanoscale widths. However, as recognized by the present Inventors, the nanotube films possess less porosity, and therefore less accessible surface area than might be anticipated. Based on this understanding, methods are described herein for forming highly porous nanotube or nanowire films to increase the accessibility of the nanotube or nanowire surface area and to thereby maximize the interfacial contact area and volume between the nanotubes or nanowires and infiltrated materials.

A method for forming porous carbon nanotube or more generally nanowire films comprises the steps of forming a composite film comprising (i) carbon nanotubes or nanowires and (ii) sacrificial nanoparticles or microparticles, and removing at least a portion of the sacrificial nanoparticles or microparticles from the composite film to form a highly porous nanotube or nanowire film. Films according to the invention provide enhanced pore volumes and high levels of accessible surface area within the body (volume) of nanotube or nanowire films. Resulting films have been found to provide both high porosity as well as high electrical conductivity.

In one embodiment, sacrificial particles of a uniform particle size (uniform defined as ±5% of a mean size) are utilized. In another embodiment, a variety of particle sizes is used, such as a distribution including both nanoparticles and microparticles.

As used herein, "nanoparticle" is used to refer to particles with at least one axis less than 100 nanometers. As used herein, "microparticle" is used to refer to particles with at least one axis between 100 nanometers and 100 micrometers. Although both nanoparticles or microparticles can generally be used with the invention, such particles will be referred to herein as nanoparticles for convenience.

Nanoparticles useful in the present invention can have an axis between 10 nanometers and 100 microns, inclusive. The nanoparticles useful in the present invention can have a diameter between 10 nanometers and 100 microns.

In one embodiment, the forming step can comprise codepositing the carbon nanotubes or nanowires and the sacrificial nanoparticles. In another embodiment, the forming step can comprise alternating deposition of carbon nanotubes or nanowires and deposition of the sacrificial nanoparticles.

In yet another embodiment, the forming step comprises a filtration method based on the filtration method described in the '546 application. The filtration method comprises providing a porous membrane, dispersing a plurality of nanotubes or nanowires along with the sacrificial nanoparticles into a solution, the solution including at least one surface stabilizing agent for preventing the nanotubes or nanowires and sacrificial nanoparticles from flocculating out of suspension, applying the solution to the membrane, and removing the solution, wherein the nanotubes or nanowires and sacrificial nanoparticles are forced onto a surface of the porous membrane to form the composite film on the surface of the membrane.

Using the filtration method the sacrificial nanoparticles and the membrane are chosen so that the sacrificial nanoparticles are too large to penetrate through the filtration membrane, but small enough to co-deposit with the nanotubes during the film formation. The filtration method film formation process can proceed with the nanoparticles in a manner that closely follows the corresponding process with the nanotubes as described in the '546 application.

Once the resulting film has been washed to remove the excess surfactant and is dried, it comprises a composite film of sacrificial nanoparticles or microparticles randomly entrapped between the nanotubes comprising the nanotube film on the surface of the membrane. To generate the increased void volume within the nanotube film a void formation step is utilized where the sacrificial nanoparticles are removed from the film.

The sacrificial nanoparticles can be removed after composite film formation by a variety of methods including dissolution, evaporation, pyrolysis, oxidation or etching processes.

In the case of the filtration method, the removal process can occur before, during or after a transfer of the film to a substrate.

In a first removal embodiment, referred to as dissolution, the sacrificial nanoparticles or microparticles selected for use are soluble in the same solvent as the filtration membrane on which the film is formed. The sacrificial nanoparticles simultaneously dissolve during the dissolution of the membrane in the transfer of the film to the substrate.

In a second removal embodiment, referred to as etching, if the sacrificial nanoparticles selected for use are insoluble in the solvent used to dissolve the membrane on which the film is formed, the particle containing film can be transferred to a substrate and the sacrificial nanoparticles subsequently dissolved, etched or vaporized away to yield the desired highly porous film.

In a third removal embodiment, if the membrane is not adversely affected by the sacrificial nanoparticle removal method, the particles can first be dissolved, etched or vaporized away and subsequently the porous film transferred to a substrate followed by dissolution of the membrane.

The method can further comprise the step of doping the SWNT film as described in the '546 application to provide either n-doped or p-doped films. Dopants can be selected from halogens and alkali metals or more complex molecular species all of which can bond ionically to the nanotubes upon the charge transfer, or can be bonded by non-covalent pi stacking interactions, along with a charge transfer, or finally can covalently bond to the nanotubes, thereby effecting the charge transfer.

The electrical conductivity of the films depends on the degree of porosity. Although not required to practice the present invention and not wishing to be bound to this theory, Applicants provide the mechanisms believed to be operable which explain the electrical properties of films according to the invention. The main impedance to current flow in a nanotube film occurs in charge transport from nanotube to nanotube (the on tube resistance is so much smaller than tube-tube "contact resistance" that the former is essentially negligible). Moreover, the smaller the overlap between two nanotubes in the film the greater the impedance to charge transport between them since "contact resistance" depends inversely on the area of the contact. Consequently, if two films of the same geometric area are made from the same quantity (mass) of nanotubes, wherein one film is a standard flat film as described in the '546 application while the other is a porous film made as described herein, then the porous film, in order to encompass the greater volume of pores must itself encompass more volume. Since the quantity of nanotubes is the same, the only way this can occur is if the nanotubes in the porous film possess less overlap with each other than exists in the standard flat film. The porous film will consequently have a higher sheet resistance. As shown in the Examples below however the change in sheet resistance in going from the standard to the porous films is not increased to a degree that degrades their utility.

As described above, prior art films possess a morphology in which the nanotubes tend to lie parallel to the plane of the film (2-D ordering). The nanotubes in the porous films however possess a more 3 dimensional morphology in which many of the nanotubes have appreciable lengths that are oriented perpendicular to the plane of the film. This is necessitated by the fact that in the composite films, prior to dissolution of the sacrificial nanoparticles, the nanotubes surround the sacrificial nanoparticles on all sides in random orientations, including those sides that lie perpendicular to the plane of the composite film upon its formation. Once the composite film is formed the nanotubes lock each other into position via van der Waals forces. When the sacrificial nanoparticles are removed (e.g. by dissolution) there is some relaxation (the degree depending upon the particle sizes), however because the nanotubes are stiff and locked together, the change in the 3-dimensional film morphology can be small.

In one embodiment, the film consists essentially of (e.g. >95%) the nanotubes or nanowires. However, in other embodiments, films according to the invention can include mixtures of nanotubes and nanowires or mixtures of nanowires of distinct materials in any proportion desired. The films can also include in some fraction nanoparticles that are not sacrificial and participate in the functionality of the final porous films.

The porous films retain much of the optical transparency of standard nanotube films. The degree of transparency depends however on the sacrificial nanoparticle sizes used in formation of the films. For two films one standard and one porous that contain the same mass of nanotube material per geometric surface area the absorptive, nanotube material, path lengths through the film are the same (ignoring nanotube orientation dependent complications) so that the amount of incident light absorbed in passing through each of the films is (to first order) the same. The light transmitted by the porous film will nevertheless be lower due to scattering of incident light out of the forward directed beam. In visual observation such scattering manifests as a haziness of some porous films. The scattering occurs because the film is comprised of dissimilar materials (the nanotubes and the air filled voids) possessing distinct indexes of refraction. The degree of scattering depends on the size of the inhomogeneities in the refractive index, relative to the wavelength of the radiation. For ~200 nm voids in a porous film the sizes of the inhomogeneities are themselves too small to result in scattering of visible light, however, statistical variations in the density of the 200 nm voids are themselves large enough to induce some scattering and impart some haze to films made with 200 nm sacrificial nanoparticles. Depending on the application, such scattering is not necessarily detrimental. In solar cell applications scattering of light throughout the film is in fact beneficial because it provides additional opportunities for light absorption. In applications where haze is undesirable the films will typically be infiltrated with a material other than air. The index of refraction of such material may naturally lie closer to that of the nanotubes, or might be tailored to do so. Such index matching avoids the interfacial reflections responsible for the scattering thereby avoiding any haze. Example of this is provided by the porous film (made using the 200 nm sacrificial particles) immersed in methanol, which exhibits a clarity indistinguishable from standard films (i.e. no haze).

There is a broad array of possible distributed electrode applications that can benefit from enhanced pore volumes and high levels of accessible surface area within the body of nanotube or nanowire films according to the present invention. For example, applications involving electrochemical reactions including their use in fuel cells can benefit from the invention. Also, applications involving charge storage, such as capacitors and batteries can benefit from the invention. Moreover, applications involving charge injection and applications involving light emission, such as photovoltaic conversion can benefit from the invention. Finally, products that can benefit from the invention include, but are not limited to, super-capacitor, battery, fuel cell electrodes, solar cells, and solid state lighting.

EXAMPLES

It should be understood that the Examples described below are provided for illustrative purposes only and do not in any way define the scope of the invention.

Figure 2:
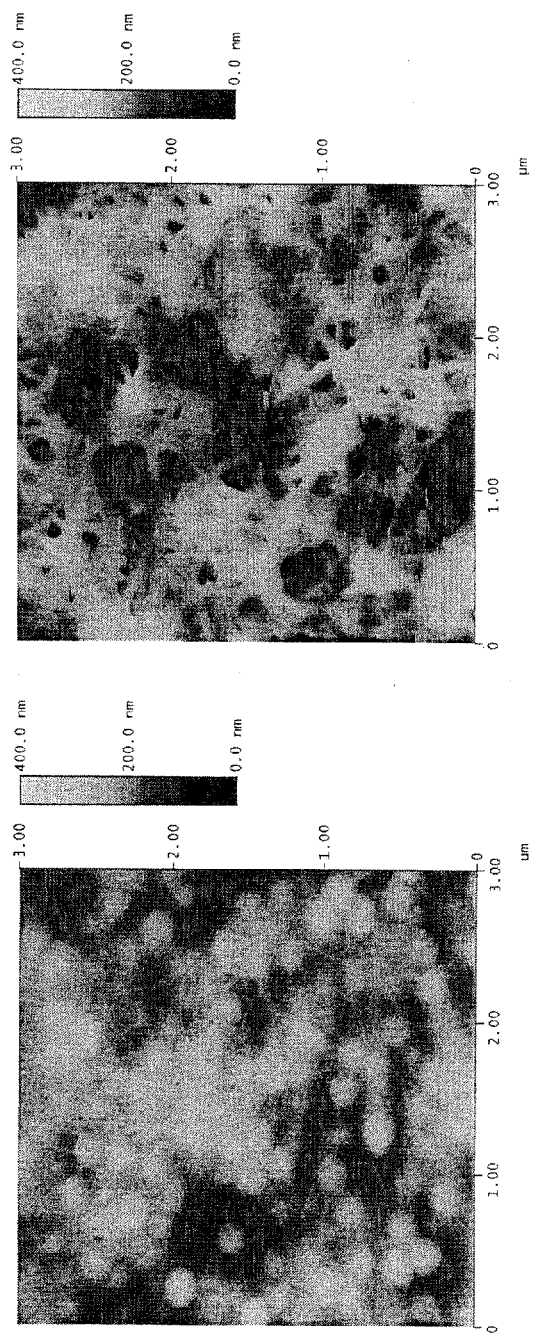
FIGS. 2(A) and (B) are scanned AFM images of a polystyrene sphere/SWNT composite film according to the invention before and after dissolution of the polystyrene spheres. All scales are the same as in FIG. 1. Note the far greater vertical variations as compared to the scanned images shown in FIG. 1.
Figure 3:
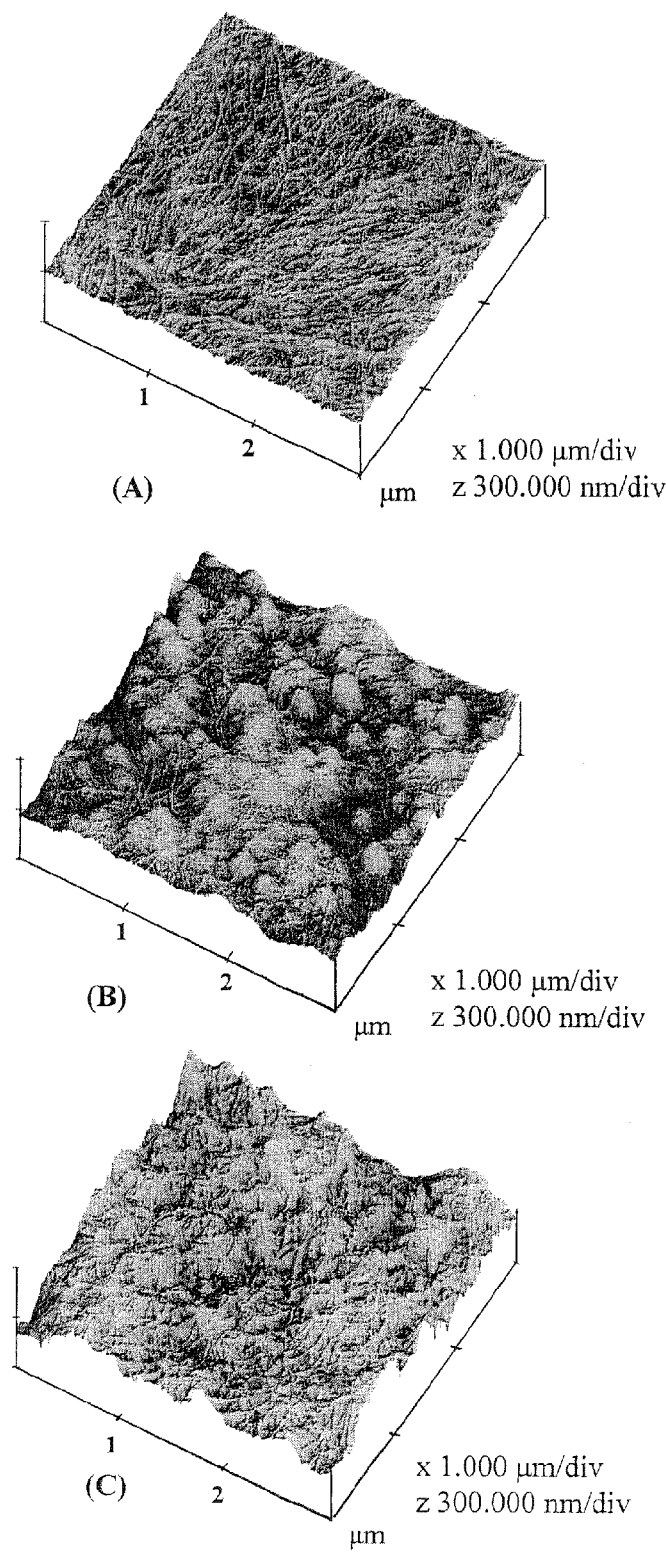
FIG. 3(A)-(C) are scanned tilted, AFM image surface plots of a standard SWNT film, a composite polystyrene sphere/SWNT film before sphere dissolution according to the invention, and after sphere dissolution, respectively.
Figure 4:
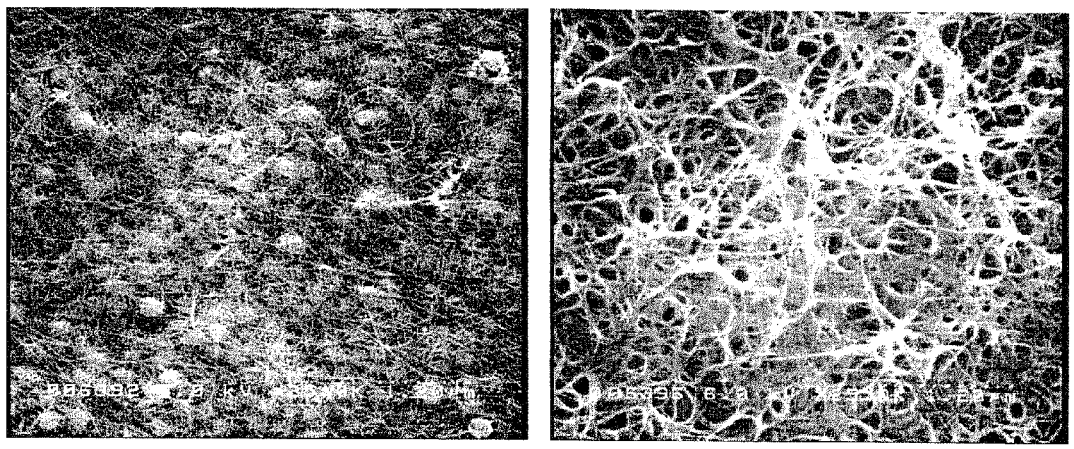
FIGS. 4(A) and (B) are scanned electron micrographs (SEMS) of a composite nanosphere/SWNT film before and after nanosphere dissolution, respectively. High resolution AFM imaging shows that what appears in FIG. 4(b) to be a thin over coating is in fact poorly resolved nanotubes.

As a demonstration of the present invention using the filtration method embodiment, nanoparticles comprises polystyrene nanospheres (uniform diameters of about 200 nm) and filtration membranes of a mixed cellulose ester (100 nm pores), both being soluble in acetone were utilized. The quantity of nanospheres used was based on that estimated to form approximately 3 monolayers of hexagonal close-packed (hcp) spheres (~520 nm thick without nanotubes). The quantity of nanotubes used was that calculated to form a film ~80 nm thick in the absence of the nanospheres. FIG. 2(a) shows a scanned AFM image of the composite film surface prior to dissolution of the polystyrene spheres on the membrane surface (prior to film transfer). FIG. 2(b) shows a scanned image of the film after the transfer of the film to a smooth Mylar substrate, during which process the polystyrene spheres have dissolved. FIGS. 3(a)-(c) are scanned tilted AFM image surface plots of the films of FIGS. 1, 2(a) and 2(b), respectively.

It is noted that following the dissolution of the nanospheres in the composite films, and their subsequent solvent washing to remove any residual polymer, the films were dried for the purpose of imaging. Because liquids exert surface tension forces as they dry, and these forces tend to collapse flexible nanostructures, it is anticipated that the film porosity and accessible surface area before drying is even greater than what was observed in the images taken. If maximum surface area of contact is required between the nanotubes and a second material that is to be infiltrated into the porous nanotube film, it is important that, where possible, such infiltration occur without drying of the nanotube film following the nanoparticle dissolution.

To measure differences in the sheet resistance between standard and porous films both a standard (flat) film and a porous film of equal geometric areas were formed from the same mass of SWNT material. The flat film thickness was approximately 80 nm and its sheet resistance (surface resistivity) was measured to be ~75 Ω/square. It should be noted that nanotubes purified by nitric acid are doped by the acid to be p-type conductors, but also that the degree of doping can change with time. The resistivity of the nanotubes therefore depends on their purification history. To ensure a fair comparison the flat and porous films were made at the same time, from the same batch of nanotube material. The porous film of this example was made using 200 nm polystyrene spheres, which were dissolved away during the film transfer to its substrate (Mylar for both films). Although the films contained the same mass of nanotubes per geometric surface area the porous film sheet resistance was measured to be 100 Ω/square. As anticipated, this is larger than the sheet resistance of the standard film (75 Ω/square), the difference, however, is not very large considering that the thickness of the porous film was approximately 600 nm thick, nearly 8 times greater than that of the flat film. Hence the porous films can retain the major fraction of the conductivity of the standard films.

Figure 5:
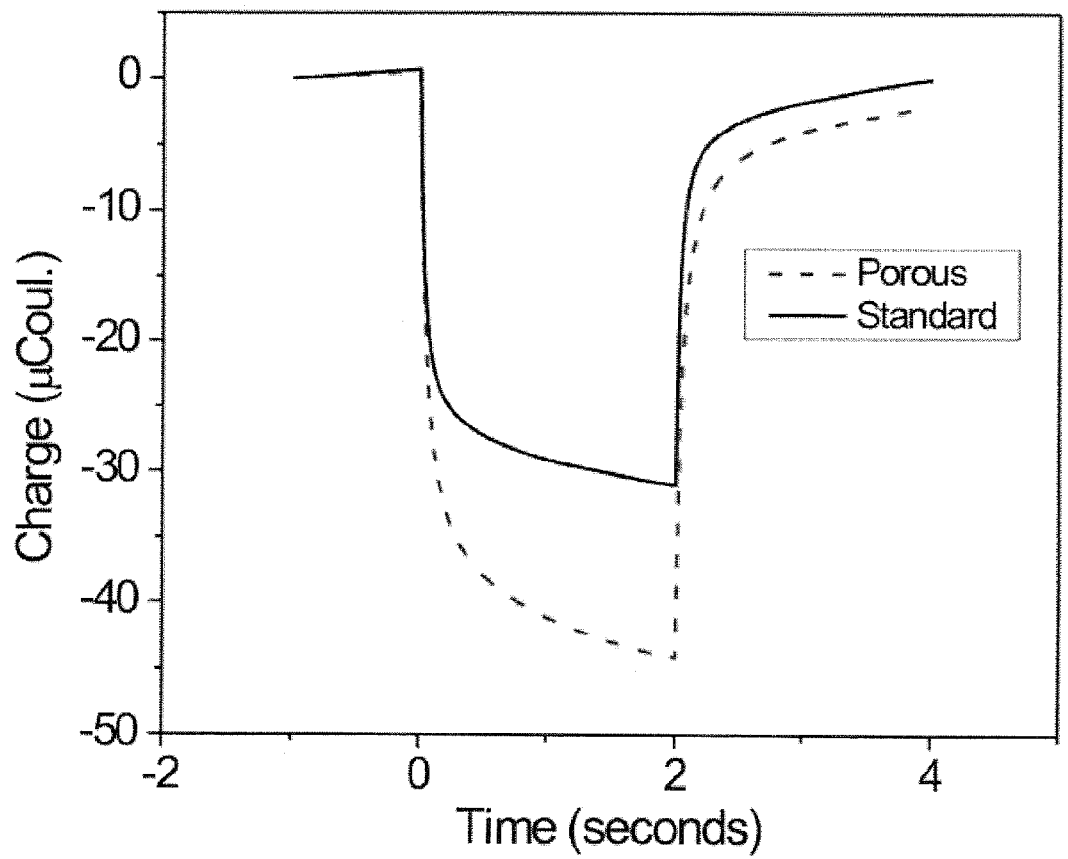
FIG. 5 compares the amount of charge stored (in μCoul) as a function of time on two electrolytic capacitors, one comprised of two porous SWNT film electrodes and the other of two standard SWNT film electrodes. The curve shown is the instantaneous charge on the porous film device divided by the corresponding instantaneous charge on the standard film device. The same mass of nanotubes per geometric surface area is exposed to the electrolyte (0.1 M KCl) in each device so that the only difference between the two devices is the morphology of the SWNT electrode films (porous versus standard).
Figure 6:
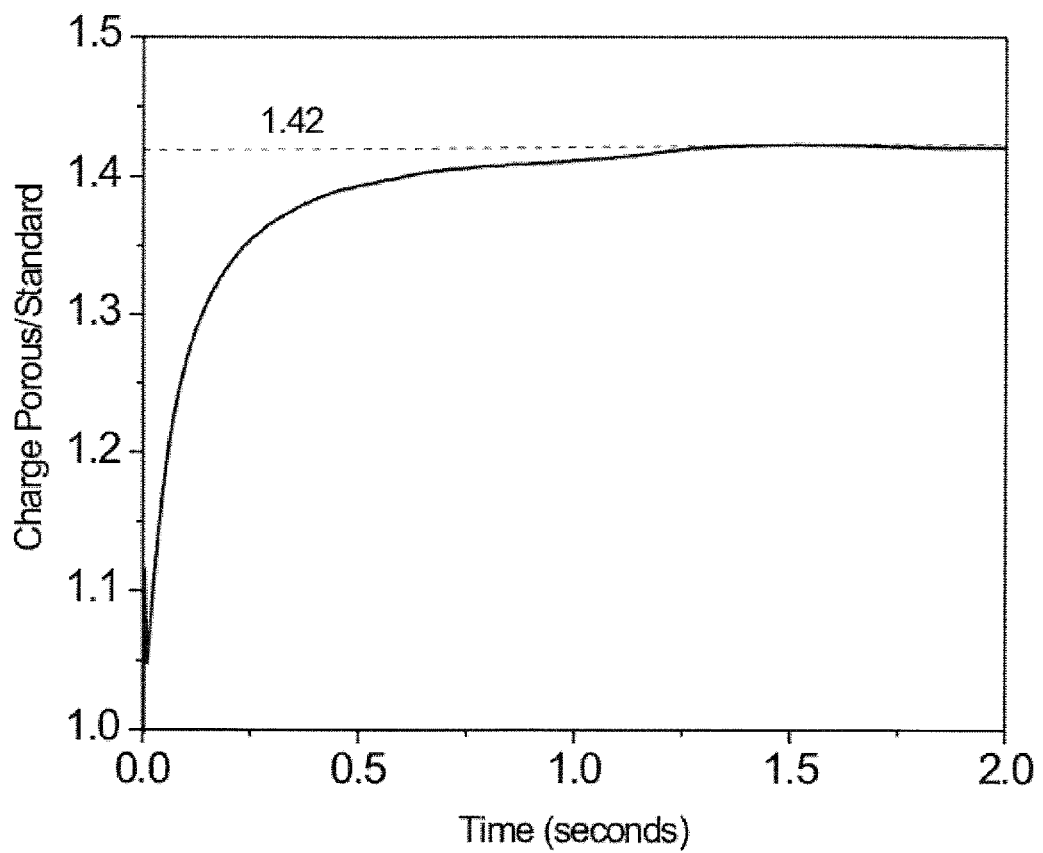
FIG. 6 shows the ratio of the charge on the porous film to the charge on the standard film, as a function of time, during the 2 second discharge cycle, from the data in FIG. 5. The porous film device is seen to have a capacitance that exceeds that of the standard film device by 42%.

As a quantitative measure of the enhanced accessible surface area in the porous films electrolytic capacitors were fabricated using two standard SWNT films as the electrodes in a standard film device and two porous films as the electrodes in a second porous film device. Each electrode used the same mass of nanotube material per geometric surface area, and the geometric area of each electrode exposed to the electrolyte (0.1 M KCl) was 0.866 cm². The standard film had a thickness of 80 nm. The porous films were of the same type as described above, made with 200 nm polystyrene spheres (which by themselves would have resulted in a hcp close-pack thickness of 520 nm). The capacitors were each charged to 0.5 V for 180 seconds. At the end of the 180 second period the potential was instantaneously switched (within 5 ms) to zero volts for two seconds after which the potential was switched back to 0.5 V for 2 seconds. FIG. 5 compares the amount of charge on each capacitor during the 2 second discharge and 2 second charge cycle. FIG. 6 plots the ratio of the charge on the porous film to the charge on the standard film for the discharge cycle. The ratio of 1.42 reached at ~1.25 seconds shows that these porous films have 42% more accessible surface area than the standard films. Because the porous and standard films expose the same mass of nanotubes to the same electrolyte over the same geometric surface area, the measurement provides clear evidence that much of the surface area in the standard films is not accessible and that this can be greatly increased by the methods described here.

As additional examples, several additional sacrificial particle systems and nanoparticle removal methods are described below:
1. Silica nanoparticles dissolved by HF.
2. Metal nanoparticles dissolved by acid, such as zinc nanoparticles dissolved by HCl.
3. Depolymerization of polymeric particles using the ceiling temperature effect.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. An electrically conductive film, comprising:
a porous film consisting of a plurality of carbon nanotubes and/or nanowires, said porous film having a distribution of pore volumes with a plurality of modes, wherein a first mode displays a first average pore volume smaller than an average bundle volume for said plurality of nanotubes and/or nanowires, and wherein a second mode displays a second average pore volume discernibly larger than said first mode, wherein said porous film provides an electrical resistivity of <0.1 Ω·cm at 25° C. and a density of between 0.05 and 0.70 g/cm³, wherein said first average pore volume has an average pore diameter of 3 to 20 nm and said second average pore volume has an average pore diameter of 100 nanometers to 100 microns.

2. The electrically conductive film of claim 1, wherein said porous film comprises >95% single walled carbon nanotubes (SWNTs).

3. The electrically conductive film of claim 1, wherein said nanotubes are n-doped or p-doped.

4. The electrically conductive film of claim 1, wherein said porous film has 3-dimensional morphology wherein a multiplicity of said nanotubes has an appreciable portion of their length oriented perpendicular to the porous film's plane.

5. The electrically conductive film of claim 1, wherein a largest mode of said plurality of modes has an average pore volume with an average pore diameter of 100 nm to 200 nm, wherein a conductive film consisting of said porous film is transparent.

6. The electrically conductive film of claim 1, further comprising a material infused in said pores.

7. The electrically conductive film of claim 6, wherein said material has a refractive index that conforms with that of said carbon nanotubes and/or nanowires so as to avoid a visible haze when exposed to light.

* * * * *